US012623899B2

(12) United States Patent　　(10) Patent No.: US 12,623,899 B2
Zou et al.　　(45) Date of Patent: May 12, 2026

(54) ABSOLUTE PRESSURE SENSING MEMS MICROPHONE, MICROPHONE UNIT AND ELECTRONIC DEVICE

(71) Applicant: GOERTEKMICROELECTRONICS CO., LTD., Qingdao (CN)

(72) Inventors: Quanbo Zou, Shandong (CN); Dexin Wang, Shandong (CN); Huabin Fang, Shandong (CN)

(73) Assignee: Goertek Microelectronics Inc., Qingdao (CN)

( * ) Notice: Subject to any disclaimer, the term of this patent is extended or adjusted under 35 U.S.C. 154(b) by 586 days.

(21) Appl. No.: 18/010,935

(22) PCT Filed: Jun. 30, 2020

(86) PCT No.: PCT/CN2020/099439
§ 371 (c)(1),
(2) Date: Dec. 16, 2022

(87) PCT Pub. No.: WO2021/253501
PCT Pub. Date: Dec. 23, 2021

(65) Prior Publication Data
US 2023/0234833 A1　　Jul. 27, 2023

(30) Foreign Application Priority Data

Jun. 16, 2020　(CN) .......................... 202010547998.2

(51) Int. Cl.
B81B 3/00　　(2006.01)
(52) U.S. Cl.
CPC .... B81B 3/0021 (2013.01); B81B 2201/0257 (2013.01); B81B 2201/0264 (2013.01);
(Continued)

(58) Field of Classification Search
CPC .... H04R 19/005; H04R 2499/11; H04R 1/04; H04R 19/04; H04R 2201/003;
(Continued)

(56) References Cited

U.S. PATENT DOCUMENTS

2013/0010996 A1　1/2013　Kim et al.
2018/0194615 A1*　7/2018　Nawaz .................. B81B 3/0027
2021/0168515 A1*　6/2021　Loeppert ................ H04R 11/04

FOREIGN PATENT DOCUMENTS

CN　108551646 A　9/2018
CN　108924720 A　11/2018
CN　110351641 A　10/2019

* cited by examiner

*Primary Examiner* — Moazzam Hossain
(74) *Attorney, Agent, or Firm* — Baker Botts LLP

(57) ABSTRACT

Embodiments of the present disclosure provides an absolute pressure sensing MEMS microphone, a microphone unit and an electronic device. The absolute pressure sensing MEMS microphone includes: a diaphragm; a back electrode plate; a spacer between the diaphragm and the back electrode plate, wherein the diaphragm, the back electrode plate and the spacer form a vacuum cavity, an air pressure in the vacuum cavity is a first air pressure, wherein a gap separating the diaphragm from the back electrode plate by the spacer is a fabrication gap, wherein in a state where the air pressure inside and outside the diaphragm are both the first air pressure, an effective vacuum gap between the diaphragm and the back electrode plate is the first vacuum gap, and wherein the first vacuum gap is larger than the fabrication gap.

11 Claims, 4 Drawing Sheets

(52) U.S. Cl.
CPC ................ *B81B 2203/0127* (2013.01); *B81B*
*2203/0315* (2013.01); *B81B 2203/04* (2013.01)

(58) Field of Classification Search
CPC .......... B81B 3/0021; B81B 2201/0257; B81B
2201/0264; B81B 2203/0127; B81B
2203/0315; B81B 2203/04
See application file for complete search history.

(A)

(B)

(C)

(A)

(B)

(C)

ABSOLUTE PRESSURE SENSING MEMS MICROPHONE, MICROPHONE UNIT AND ELECTRONIC DEVICE

CROSS-REFERENCE TO RELATED APPLICATIONS

This application is a National Stage of International Application No. PCT/CN2020/099439, filed on Jun. 30, 2020, which claims priority to Chinese Patent Application No. 202010547998.2, filed on Jun. 16, 2020, both of which are hereby incorporated by reference in their entireties.

TECHNICAL FIELD

The present disclosure relates to the technical field of MEMS microphones, and in particular, to an absolute pressure sensing MEMS microphone, a microphone unit and an electronic device.

BACKGROUND

In an absolute pressure sensor, one side of a pressure sensing membrane is a vacuum and the other side is a pressure environment to be sensed. The vacuum here refers to an approximate vacuum, which can be an environment where the air pressure is much lower than the standard atmospheric pressure.

FIG. 1 shows different states of a microelectromechanical system (MEMS) absolute pressure sensor. The MEMS absolute pressure sensor shown in FIG. 1 may be a capacitive type sensor. In FIG. 1, a pressure sensing membrane 11, an electrode plate 12 and a spacer 13 form a vacuum cavity 14.

FIG. 1(A) shows a state of the MEMS absolute pressure sensor in a vacuum environment with no operating bias applied. As shown in FIG. 1(A), the pressure sensing membrane 11 is located at a flat position P. FIG. 1(A) may be the state when the MEMS absolute pressure sensor is fabricated.

FIG. 1(B) shows a state of the MEMS absolute pressure sensor in an atmospheric pressure environment with no operating bias applied. As shown in FIG. 1(B), due to the effect of atmospheric pressure, the pressure sensing membrane 11 deviates from the flat position P and is concavely depressed downwards. FIG. 1(B) may be the state when the MEMS absolute pressure sensor is not used.

FIG. 1(C) shows a state of the MEMS absolute pressure sensor in an atmospheric pressure environment under the condition of applying a working bias. As shown in FIG. 1(C), due to the atmospheric pressure and the working bias, the pressure sensing membrane 11 deviates from the flat position P and is further concavely depressed downwards. FIG. 1(C) may be the state of the MEMS absolute pressure sensor when it is used.

Since the pressure referenced by the absolute pressure sensor for sensing is vacuum pressure, the absolute pressure sensor is not susceptible to atmospheric pressure changes and/or temperature changes.

However, the pressure sensing membrane 11 of the absolute pressure sensor needs to resist the atmospheric pressure Po, and will be greatly deformed. Therefore, the absolute pressure sensor is generally used for pressure sensing and is not suitable for microphones.

If it is desired to achieve the same sensitivity as a traditional MEMS microphone (for example, about 5-10 mV/Pa), then the initial vacuum gap of the absolute pressure sensor (the gap between the pressure sensing membrane 11 and the electrode plate 12 shown in FIG. 1(A), where the inside and outside of the pressure sensing membrane 11 are vacuum) needs to be set relatively large, about 15-20 μm or more. This not only greatly increases the difficulty of fabricating processes, but also makes the area of the diaphragm (pressure sensing membrane) very large due to the requirement that the effective capacitance Cmic of the MEMS microphone matches the MEMS microphone, which further increases the cost of the MEMS microphone. In addition, when the flat diaphragm is displaced/warped towards the back electrode plate, the center of the diaphragm has the greatest deflection, while most of the surrounding area of the diaphragm contributes little to the performance of the microphone, which increases the difficulty of improving performance.

Therefore, a new MEMS microphone needs to be provided.

SUMMARY

Embodiments of the present disclosure provide new technical solutions for MEMS microphones.

According to a first aspect of the present disclosure, there is provided an absolute pressure sensing MEMS microphone, including: a diaphragm; a back electrode plate; a spacer between the diaphragm and the back electrode plate, wherein the diaphragm, the back electrode plate and the spacer form a vacuum cavity, and an air pressure in the vacuum cavity is a first air pressure, wherein a gap separating the diaphragm from the back electrode plate by the spacer is a fabrication gap, wherein, in a state where air pressures inside and outside the diaphragm both are the first air pressure, an effective vacuum gap between the diaphragm and the back electrode plate is a first vacuum gap, and wherein the first vacuum gap is larger than the fabrication gap.

According to a second aspect of the present disclosure, a microphone unit is provided, including a unit shell, the absolute pressure sensing MEMS microphone disclosed here and an integrated circuit chip, wherein the absolute pressure sensing MEMS microphone and the integrated circuit chip are arranged in the unit shell.

According to a third aspect of the present disclosure, an electronic device is provided, including the microphone unit disclosed herein.

In various embodiments, a thin diaphragm may be used in an absolute pressure sensing MEMS microphone, thereby increasing the sensitivity of the microphone.

It should be understood that the above general description and the following detailed description are only exemplary and explanatory, and are not intended to limit the embodiments of present disclosure.

In addition, any embodiment in the present disclosure does not need to achieve all the above-mentioned effects.

Embodiments of the present disclosure will become apparent through the following detailed description of the exemplary embodiments of the present disclosure with reference to the accompanying drawings.

BRIEF DESCRIPTION OF THE DRAWINGS

In order to more clearly illustrate the technical solutions in the embodiments of the present disclosure or prior art, the following will briefly introduce the drawings used in the embodiments or prior art. Obviously, the drawings in the following description are only some embodiments described in the embodiments of present disclosure, and those skilled in the art can also obtain other drawings based on these drawings.

DETAILED DESCRIPTION

Figure 1:
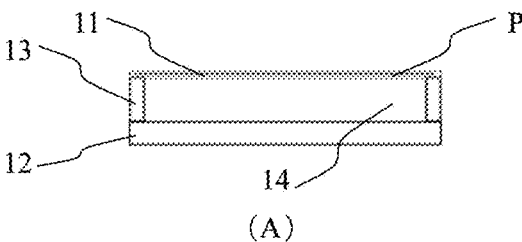
FIG. 1 shows states of an absolute pressure sensor under different conditions.
Figure 1:
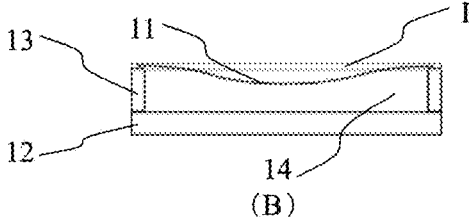
Figure 1:
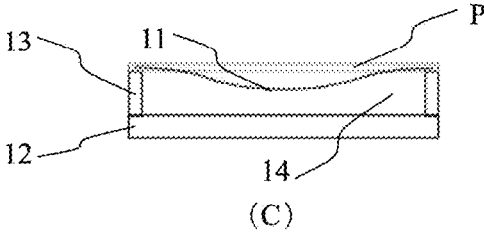

Various exemplary embodiments will now be described in detail with reference to the accompanying drawings.

The following description of at least one exemplary embodiment is merely illustrative in nature and is in no way intended to limit the invention, its application or uses.

It should be noted that similar reference numerals and letters refer to similar items in the following figures, and thus once an item is defined in one figure, it is possible that it need not be further discussed for following figures.

Various embodiments and examples of the present disclosure are described with reference to the accompanying drawings.

It is proposed here that in absolute pressure sensing MEMS microphones, the diaphragm is pre-bent to increase the sensitivity of the microphone.

Figure 2:
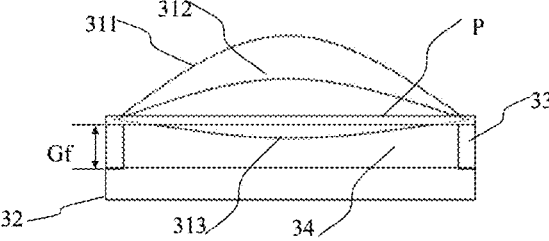
FIG. 2 shows state changes of an absolute pressure sensing MEMS microphone under different conditions according to one embodiment.

For example, see FIG. 2, which illustrates state changes of an absolute pressure sensing MEMS microphone under different conditions according to one embodiment. The absolute pressure sensing MEMS microphone includes: a diaphragm, a back electrode plate 32 and a spacer 33.

Reference numerals 311, 312, and 313 are the positions of the diaphragm under different conditions. Curve 311 indicates the position of the diaphragm when both of the air pressures inside and outside the diaphragm are the first air pressure. The inside of the diaphragm refers to the side where the diaphragm is located in the vacuum cavity 34. Curve 312 indicates the position of the diaphragm when the air pressure outside the diaphragm is 1 atmosphere. Curve 313 indicates the position of the diaphragm when the air pressure outside the diaphragm is 1 atmosphere and an operating bias is applied between the diaphragm and the back electrode plate 32.

The spacer 33 is located between the diaphragm and the back electrode plate 32. The spacer 33 can be a separate spacer layer, or a part of a chip substrate.

The diaphragm, the back electrode plate 32 and the spacer 33 form the vacuum cavity 34. The air pressure in the vacuum cavity 34 is the first air pressure. In reality, an absolute vacuum cannot be achieved. Therefore, an environment whose air pressure is much lower than atmospheric pressure is generally called vacuum environment. In this vacuum environment, there is still a zero-approaching air pressure. Here, the zero-approaching air pressure is defined as the first air pressure.

As shown in FIG. 2, the gap Gf separating the diaphragm and the back electrode plate 32 by the spacer 33 is a fabrication gap. The fabrication gap Gf can be a distance between the back electrode plate 32 and the flat position P of the diaphragm.

In the state where the air pressure inside and outside the diaphragm is the first air pressure, the diaphragm is at the position of the curve 311, and the effective vacuum gap (for example, the average vacuum gap) between the diaphragm position curve 311 and the back electrode plate 32 is the first vacuum gap. The first vacuum gap is larger than the fabrication gap Gf.

Here, the vacuum pressure sensing device is used for the MEMS microphone, so that the advantages of the vacuum pressure sensing device can be utilized.

In addition, in order to improve the sensitivity of the MEMS microphone, the diaphragm is pre-bent, so that the soft diaphragm can also be used to form a vacuum cavity, so that the absolute pressure sensor can be used as a microphone to provide a sensitivity similar to conventional MEMS microphone.

For example, the first vacuum gap is greater than or equal to twice the fabrication gap. In addition, the first vacuum gap is less than or equal to 10 times the fabrication gap.

In addition, at standard atmospheric pressure, the effective vacuum gap between the diaphragm (curve 312) and the back electrode plate 32 is the second vacuum gap. The second vacuum gap is larger than the fabrication gap Gf. In this way, the extent of downward bending of the diaphragm (curve 313) which is applied an operating bias is reduced.

Figure 3:
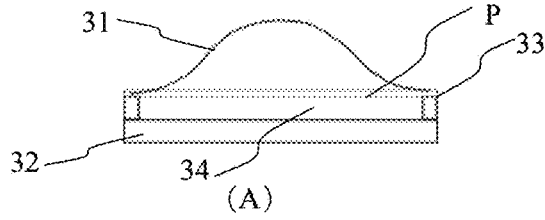
FIG. 3 shows states of an absolute pressure sensing MEMS microphone under different conditions according to one embodiment.
Figure 3:
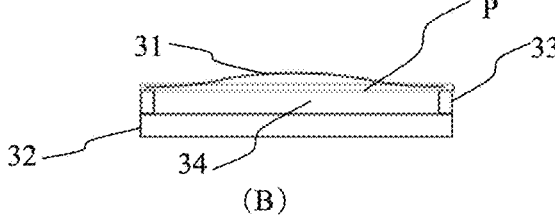
Figure 3:
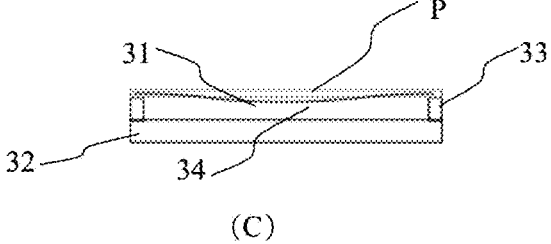

FIG. 3(A), FIG. 3(B), and FIG. 3(C) respectively show the states of the diaphragm 31 under different conditions. In FIG. 3, a diaphragm 31, a back electrode plate 32 and a spacer 33 form a vacuum cavity 34.

In the state shown in FIG. 3(A), both of the air pressures inside and outside the diaphragm are vacuum air pressure. In this case, the pressure on both sides of the diaphragm 31 is the same, and the diaphragm 31 is in a free state. The diaphragm 31 is pre-bent to deviate from the flat position P.

In the state shown in FIG. 3(B), both of the air pressures inside and outside the diaphragm are atmospheric pressure. In this case, the pressure outside of the diaphragm 31 is greater than the pressure inside of the diaphragm 31. The diaphragm 31 is pressed toward the back electrode plate 32 by atmospheric pressure. In FIG. 3(B), due to being pre-bent, the diaphragm 31 is still located outside the flat position P.

In the state shown in FIG. 3(C), the air pressure outside the diaphragm 31 is atmospheric pressure and an operating bias is applied between the back electrode plate 32 and the diaphragm 31. In this case, due to the action of the operating bias, the diaphragm 31 is attracted by the back electrode plate 32 and further approaches the back electrode plate 32. In FIG. 3(B), due to being pre-bent, the extent of deviation of the diaphragm 31 from the flat position P is small. In FIG. 3(B), the diaphragm 31 is located at the side of the flat position P close to the back electrode plate 32. However, by setting the extent of pre-bending of the diaphragm 31, the diaphragm 31 can still be located outside the flat position P when an operating bias is applied.

When the diaphragm 31 is working, try to set the diaphragm 31 near the flat position P to provide better performance of the MEMS microphone. For example, at the standard atmospheric pressure, the effective vacuum gap between the diaphragm (curve 313) and the back electrode plate 32 is the third vacuum gap when an operating bias is applied. The third vacuum gap is greater than or equal to 80% of the fabrication gap and less than or equal to 120% of the fabrication gap. In this way, it is possible to ensure that the diaphragm (curve 313) is in a proper working position, so as to ensure that the diaphragm is in a good working condition.

The diaphragm can be pre-deviated through the stress structure, so that the first vacuum gap is larger than the fabrication gap.

By using the stress of the diaphragm (thin film) to pre-deviate the diaphragm 31 to deviate from the back electrode plate 32, a large initial gap Gi (that is, the effective vacuum gap between the diaphragm curve 311 and the back electrode plate 32 when the air pressure outside the diaphragm 31 Po=0) required for high sensitivity can be obtained without increasing the difficulty of fabricating process (for example, the fabrication gap Gf). In this way, when the air pressure outside the diaphragm 31 Po=1 atm (that is, one standard atmosphere), the gap Go between the diaphragm 31 (curve 312) and the back electrode plate 32 is relatively large, and the VP (Collapse voltage) of the microphone can be increased, thereby improving the sensitivity of the MEMS microphone.

A detailed analysis of the performance of the microphone is as follows. Here, it is assumed that the mechanical sensitivity of the MEMS microphone is linear.

Assume that when Po=0, the first vacuum gap is Gi, that is, the effective vacuum gap between the curve 311 and the back electrode plate 32 in FIG. 1; when Po=1 atm, effective value of the mechanical sensitivity of the diaphragm 31 is $Sm^0$, the second vacuum gap is Go, that is, the effective vacuum gap between the curve 312 and the back electrode plate 32 in FIG. 1; when Po=1 atm and an operating bias VB is applied between the diaphragm 31 and the back electrode plate 32, the third vacuum gap is Ge, that is, the effective vacuum gap between the curve 313 and the back electrode plate 32 in FIG. 1.

Maximum open circuit sensitivity of microphones Soc.max~$(k \cdot VP/Ge) \cdot Sm^0$. Usually, the maximum value of the VB/VP ratio is 75%, therefore, k~75%. Here, "~" means approximately or approximately equal to.

$VP=(8Go^3/27\varepsilon_0 Sm^0)^{0.5}$, where $\varepsilon_0$ is the vacuum dielectric constant.

$Wo=Sm^0 Po=(Gi-Go)/Po$, where Wo is the effective deformation of the diaphragm caused by the atmospheric pressure Po.

Therefore, the maximum sensitivity of the MEMS microphones Soc.max~$(Go^3 Sm^0/6\varepsilon_0 Ge^2)^{0.5}=[Go^3(Gi-Go)/12\varepsilon_0 PoGe^2]^{0.5}$.

When Ge is guaranteed so that the MEMS can work stably, the maximum value Soc of the sensitivity of the MEMS microphone is located at Go=¾Gi. The sensitivity at this time is Soc.max~$(\%_{16})Gi^2/[Ge(12\varepsilon_0 Po)^{0.5}]$. It is in direct correlation to the initial gap Gi after pre-deviated.

In existing absolute pressure sensors, the pressure sensing membrane is not pre-deviated. That is to say, in the existing absolute pressure sensors, Gi in the above formula is equal to the fabrication gap Gf, that is, Gi=Gf.

Here, the extent of pre-deviation can be increased so that Gi>>Gf, so that the sensitivity and SNR (signal-to-noise ratio) of the MEMS microphone are greatly improved.

In addition, since the diaphragm is pre-deviated, a small fabrication gap can be used, so that the diaphragm can also be small, thereby reducing the cost of the chip.

FIGS. 4-7 illustrate various embodiments of using stress structures to pull the diaphragm into a desired state. Here, the fabrication gap (i.e., thickness of sacrificial layer in the MEMS microphone) Gf=0.1-2 um. After the MEMS microphone is released, the back electrode plate and the diaphragm form a vacuum cavity. When both inside and outside the vacuum cavity are vacuum, the ratio of the effective gap between the diaphragm and the back electrode plate to the second vacuum gap G at standard atmospheric pressure Gi/Gf>>1 (for example, Gi is 2-10 times Gf).

Figure 4:
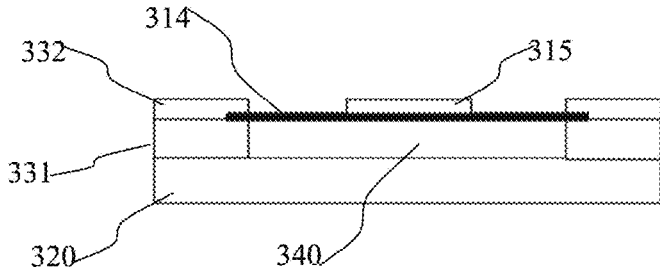
FIG. 4 shows a schematic diagram of an absolute pressure sensing MEMS microphone according to one embodiment.

In the embodiment of FIG. 4, the diaphragm 314, the back electrode plate 320, and the spacer 331 form a vacuum cavity 340.

In the embodiment of FIG. 4, the stress structure includes a diaphragm 314 and a compressive stress component 315. The diaphragm 314 has a tensile stress along the surface direction of the diaphragm. The compressive stress component 315 is attached to outside of the diaphragm 314 relative to the vacuum cavity 340, and has a compressive stress along the surface direction of the diaphragm 314.

Figure 5:
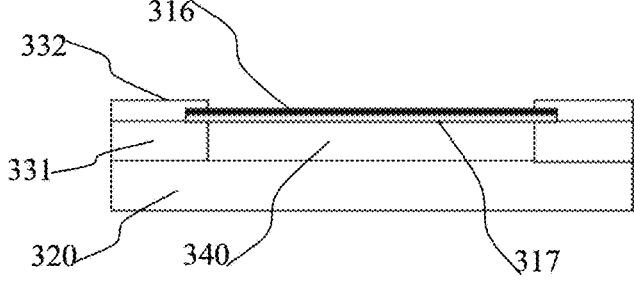
FIG. 5 shows a schematic diagram of an absolute pressure sensing MEMS microphone according to another embodiment.

In the embodiment of FIG. 5, the diaphragms 316, 317, the back electrode plate 320, and the spacer 331 form a vacuum cavity 340. The fixing member 332 fixes the diaphragm 316, 317 to the spacer 331.

In the embodiment of FIG. 5 the stress structure includes complex layers 316, 317 of the diaphragm.

Complex layers 316, 317 include an inner film 317 located inside the vacuum cavity and an outer film 316 located outside. The inner film 317 has a tensile stress along the surface direction of the diaphragm, and the outer film 316 has a compressive stress along the surface direction of the diaphragm.

Figure 6:
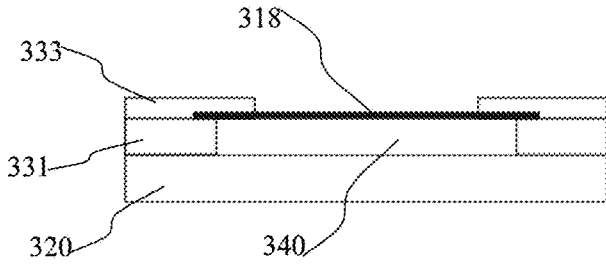
FIG. 6 shows a schematic diagram of an absolute pressure sensing MEMS microphone according to yet another embodiment.

In the embodiment of FIG. 6, the diaphragm 318, the back electrode plate 320, and the spacer 331 form a vacuum cavity 340. The fixing member 332 fixes the diaphragm 318 to the spacer 331. The fixing member 332 has a tensile stress in the surface direction of the diaphragm and is attached to the upper surface (i.e., the outer surface) of the diaphragm. The spacer 331 has a compressive stress in the direction of the surface of the diaphragm and is attached to the lower surface (i.e., inner surface) of the diaphragm.

Figure 7:
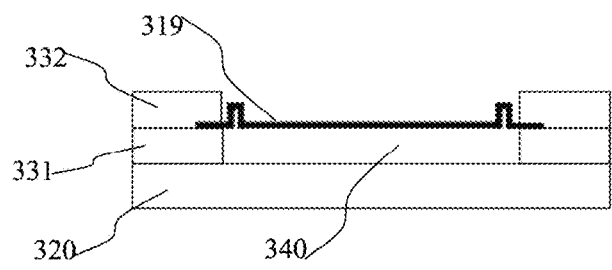
FIG. 7 shows a schematic diagram of an absolute pressure sensing MEMS microphone according to yet another embodiment.

In the embodiment shown in FIG. 7, the stress structure includes a corrugated membrane structure 319 on the diaphragm, so that the diaphragm bulges outwards relative to the vacuum cavity.

Figure 8:
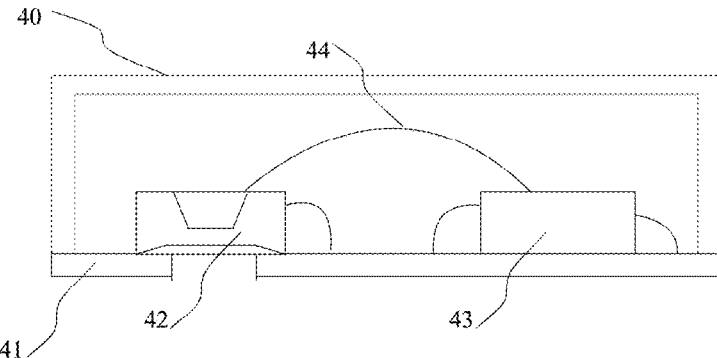
FIG. 8 shows a schematic diagram of a microphone unit according to an embodiment disclosed herein.

FIG. 8 shows a schematic diagram of a microphone unit according to an embodiment disclosed herein.

As shown in FIG. 8, the microphone unit 40 includes a unit shell 41, the above-described absolute pressure sensing MEMS microphone 42 and an integrated circuit chip 43. An absolute pressure sensing MEMS microphone 42 and an integrated circuit chip 43 are arranged in the unit shell 41. The absolute pressure sensing MEMS microphone 42 corresponds to an inlet of the unit shell 41. The absolute pressure sensing MEMS microphone 42, the integrated circuit chip 43 and the circuit in the unit shell 41 are connected through leads 44.

Figure 9:
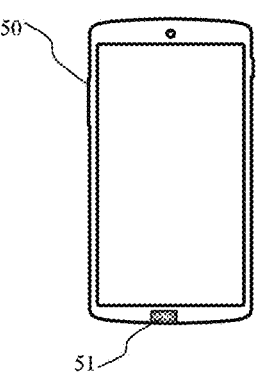
FIG. 9 shows a schematic diagram of an electronic device according to an embodiment disclosed herein.

FIG. 9 shows a schematic diagram of an electronic device according to an embodiment disclosed herein.

As shown in FIG. 9, the electronic device 50 may include the microphone unit 51 shown in FIG. 8. The electronic device 50 may be a mobile phone, a tablet computer, a wearable apparatus, and the like.

The above is only the specific implementation of the embodiment of the present disclosure. It should be pointed out that for those of ordinary skill in the art, without departing from the principle of the embodiment of the present disclosure, some improvements and modifications can also be made. These improvements and modifications should also be regarded as the scope of the embodiments of the present disclosure.

The invention claimed is:

1. An absolute pressure sensing MEMS microphone, comprising:

a diaphragm;

a back electrode plate;

a spacer between the diaphragm and the back electrode plate, wherein, the diaphragm, the back electrode plate and the spacer form a vacuum cavity having a first air pressure, wherein, the spacer forms a fabrication gap between the diaphragm and the back electrode plate, wherein, in a state where an air pressures outside the diaphragm is at the first air pressure, an effective vacuum gap between the diaphragm and the back electrode plate is a first vacuum gap, wherein, the first vacuum gap is larger than the fabrication gap, and wherein, at a standard atmospheric pressure without an operating bias, the effective vacuum gap between the diaphragm and the back electrode plate is a second vacuum gap, and the second vacuum gap is larger than the fabrication gap.

2. The absolute pressure sensing MEMS microphone according to claim 1, wherein the first vacuum gap is greater than twice the fabrication gap or equal to twice the fabrication gap.

3. The absolute pressure sensing MEMS microphone according to claim 2, wherein the first vacuum gap is less than or equal to 10 times the fabrication gap.

4. The absolute pressure sensing MEMS microphone according to claim 1, wherein, at standard atmospheric pressure, under a state that an operating bias is applied, the effective vacuum gap between the diaphragm and the back electrode plate is a third vacuum gap, and the third vacuum gap is greater than or equal to 80% of the fabrication gap and less than or equal to 120% of the fabrication gap.

5. The absolute pressure sensing MEMS microphone according to claim 1, wherein the diaphragm is pre-deviated by a stress structure, so that the first vacuum gap is larger than the fabrication gap.

6. The absolute pressure sensing MEMS microphone according to claim 5, wherein the stress structure comprises the diaphragm and a compressive stress component, wherein, the diaphragm has a tensile stress along a surface direction of the diaphragm surface, and wherein, the compressive stress component is attached to outside of the diaphragm relative to the vacuum cavity, and has a compressive stress along the surface direction of the diaphragm.

7. The absolute pressure sensing MEMS microphone according to claim 5, wherein said stress structure comprises a composite layer of the diaphragm, wherein, the composite layer includes an inner film located inside the vacuum cavity and an outer film located outside, wherein, the inner film has a tensile stress along a surface direction of the diaphragm and the outer film has a compressive stress along the surface direction of the diaphragm.

8. The absolute pressure sensing MEMS microphone according to claim 5, wherein the stress structure includes the spacer and a fixing member securing the diaphragm to the spacer, wherein, the fixing member has a tensile stress along a surface direction of the diaphragm and is attached to an upper surface of the diaphragm, and the spacer has a compressive stress along the surface direction of the diaphragm and is attached to a lower surface of the diaphragm.

9. The absolute pressure sensing MEMS microphone according to claim 5, wherein the stress structure comprises a corrugated membrane structure on the diaphragm, so that the diaphragm bulges outwards relative to the vacuum cavity.

10. A microphone unit, comprising a unit shell, the absolute pressure sensing MEMS microphone according to claim 1 and an integrated circuit chip, wherein the absolute pressure sensing MEMS microphone and the integrated circuit chip are arranged in the unit shell.

11. An electronic device comprising the microphone unit according to claim 10.

* * * * *